(12) United States Patent
Wu et al.

(10) Patent No.: US 9,575,227 B2
(45) Date of Patent: Feb. 21, 2017

(54) COLOR FILTER SUBSTRATE AND MANUFACTURING METHOD THEREOF, ORGANIC ELECTROLUMINESCENT DISPLAY PANEL AND DISPLAY DEVICE

(71) Applicant: BOE TECHNOLOGY GROUP CO., LTD., Beijing (CN)

(72) Inventors: Changyen Wu, Beijing (CN); Junran Wang, Beijing (CN); Kun Cao, Beijing (CN); Dongfang Wang, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 165 days.

(21) Appl. No.: 14/437,074

(22) PCT Filed: Sep. 25, 2014

(86) PCT No.: PCT/CN2014/087384
§ 371 (c)(1),
(2) Date: Apr. 20, 2015

(87) PCT Pub. No.: WO2015/161624
PCT Pub. Date: Oct. 29, 2015

(65) Prior Publication Data
US 2016/0334553 A1    Nov. 17, 2016

(30) Foreign Application Priority Data

Apr. 23, 2014    (CN) .......................... 2014 1 0165881

(51) Int. Cl.
*H01J 1/62*    (2006.01)
*G02B 5/20*   (2006.01)
(Continued)

(52) U.S. Cl.
CPC ................ *G02B 5/201* (2013.01); *G02B 5/20* (2013.01); *G02F 1/1335* (2013.01); *H01L 21/77* (2013.01);
(Continued)

(58) Field of Classification Search
CPC ........... G02F 1/1335; G02B 5/20; H01L 27/32
(Continued)

(56) References Cited

FOREIGN PATENT DOCUMENTS

| CN | 1540371 A | 10/2004 |
|---|---|---|
| CN | 101430397 A | 5/2009 |

(Continued)

OTHER PUBLICATIONS

International Patent Application No. PCT/CN2014/087384, Written Opinion of the International Searching Authority dated Jan. 26, 2015, six (6) pages.
(Continued)

*Primary Examiner* — Vip Patel
(74) *Attorney, Agent, or Firm* — Nath, Goldberg & Meyer; Joshua B. Goldberg

(57) ABSTRACT

The present invention provides a color filter substrate and a manufacturing method thereof, an organic electroluminescent display panel and a display device. The color filter substrate of the present invention comprises a first base, and a plurality of color filters and black matrixes arranged on the first base, wherein two adjacent color filters are at least partially overlapped, and each black matrix is at least partially arranged at the overlapped position of the two adjacent color filters; and the color filter substrate further comprises a first adhesive layer for eliminating section differences between the adjacent color filters or between the color filters and the black matrixes, and the first adhesive layer is provided with scattering particles therein. The color (Continued)

filter substrate can be used in the organic electroluminescent display panel.

20 Claims, 2 Drawing Sheets

(51) Int. Cl.
G02F 1/1335 (2006.01)
H01L 21/77 (2006.01)
H01L 27/32 (2006.01)
H05B 33/04 (2006.01)
H05B 33/10 (2006.01)

(52) U.S. Cl.
CPC ............... *H01L 27/32* (2013.01); *H05B 33/04* (2013.01); *H05B 33/10* (2013.01)

(58) Field of Classification Search
USPC .................................................. 313/498, 506
See application file for complete search history.

(56) References Cited

FOREIGN PATENT DOCUMENTS

| | | |
|---|---|---|
| CN | 101488515 A | 7/2009 |
| CN | 101946193 A | 1/2011 |
| CN | 202512327 U | 10/2012 |
| CN | 202677025 U | 1/2013 |
| CN | 104009062 A | 8/2014 |
| JP | 2008165108 A | 7/2008 |

OTHER PUBLICATIONS

International Patent Application No. PCT/CN2014/087384, International Search Report dated Jan. 26, 2015, thirteen (13) pages.

COLOR FILTER SUBSTRATE AND MANUFACTURING METHOD THEREOF, ORGANIC ELECTROLUMINESCENT DISPLAY PANEL AND DISPLAY DEVICE

This is a National Phase Application filed under 35 U.S.C. §371 as a national stage of PCT/CN2014/087384, filed Sep. 25, 2014, an application claiming the benefit to Chinese Application No. 201410165881.2, filed Apr. 23, 2014; the content of each of which is hereby incorporated by reference in its entirety.

FIELD OF THE INVENTION

The present invention belongs to the field of organic electroluminescent display technology, and particularly relates to a color filter substrate and a manufacturing method thereof, an organic electroluminescent display panel and a display device.

BACKGROUND OF THE INVENTION

The basic structure of an organic electroluminescent device (e.g. OLED) includes an anode layer, a cathode layer and a "luminescent layer" sandwiched between the anode layer and the cathode layer, wherein the luminescent layer includes one or more organic layers. Under the action of an external voltage, electrons and holes are respectively injected into the organic layers from the cathode and the anode and then migrated and compounded in the "luminescent layer" to produce excitons, and the energy of the excitons is attenuated in the form of light, namely light is radiated.

In the luminescent process of the organic electroluminescent device, energy loss is mainly on two aspects. First, when injected carriers emit light by coupling in the luminescent layer, not all injected energy is transformed into photons, a part of energy of the excitons is lost by a non-radiative transition process such as lattice vibration or deep-level impurity transition, and this process may be described with internal quantum efficiency. Second, only about 20% of light emitted from the luminescent layer may penetrate through the device to enter air after passing through above multilayer structures and is seen due to total reflection occurring on the interfaces between the anode layer and a base of the organic electroluminescent device, between the base and air and the like, a waveguide mode occurring on the interface between the anode layer and the luminescent layer of the organic electroluminescent device, surface plasma loss nearby metal electrodes and the like.

As shown in FIG. 1, an organic electroluminescent display panel includes a color filter substrate and an array substrate subjected to cell aligning, gaps formed after cell aligning of the color filter substrate and the array substrate are filled with an adhesive layer 300, color filters 101 and black matrixes 102 are arranged on a first base 100 of the color filter substrate, and organic electroluminescent devices (which are obtained by defining an organic electroluminescent material layer 201 with a pixel defining layer 202) are arranged on a second base 200 of the array substrate. Due to the loss of energy in the luminescent process of the organic electroluminescent device, the light output efficiency of the organic electroluminescent device is low, then the light output efficiency of the organic electroluminescent display panel is low, and the display effect is poor.

SUMMARY OF THE INVENTION

The technical problem to be solved by the present invention is to provide a color filter substrate with improved light output efficiency and a manufacturing method thereof, an organic electroluminescent display panel and a display device, which can solve the problem that an existing organic electroluminescent display panel is low in light output efficiency.

The technical solutions adopted for solving the technical problems of the present invention involve a color filter substrate, including a first base, and a plurality of color filters and black matrixes arranged on the first base, wherein two adjacent color filters are at least partially overlapped, and each black matrix is at least partially arranged at the overlapped position of the two adjacent color filters; and wherein the color filter substrate further includes a first adhesive layer for eliminating section differences between the adjacent color filters or between the color filters and the black matrixes, and the first adhesive layer is provided with scattering particles therein.

The first adhesive layer of the color filter substrate of the present invention is provided with the scattering particles, which may scatter light coming from a display light source, so that the light is more divergent and softer and the uniformity of the light is improved. In addition, in the present invention, the two adjacent color filters are at least partially overlapped, and the overlapped part of the two color filters is also equivalent to a black matrix; meanwhile, each black matrix on the color filter substrate is at least partially arranged at the overlapped position of the two adjacent color filters, which is equivalent to increasing the thickness of the black matrixes on the color filter substrate; and it could be understood that, a color filter with a color (that is, corresponding to a sub-pixel) is arranged between two adjacent black matrixes, and under such a condition, because the thickness of the black matrixes is increased, the light corresponding to the sub-pixel may be effectively prevented from being scattered to a sub-pixel adjacent to the sub-pixel after being scattered by the scattering particles, and thus brightness loss is avoided.

Preferably, the black matrixes are arranged on the first base, and the overlapped part of the two adjacent color filters is above each black matrix.

Preferably, the color filters are arranged on the first base, and each black matrix is arranged above the overlapped part of the two adjacent color filters.

Preferably, the scattering particles have material including any one or more of silicon oxide, zinc sulfide and zinc selenide.

Preferably, the first adhesive layer is also provided with water absorbing particles.

Further preferably, the water absorbing particles have material including barium oxide or magnesium oxide.

The technical solutions adopted for solving the technical problems of the present invention involve an organic electroluminescent display panel, including the above color filter substrate and an array substrate which is cell-aligned with the color filter substrate.

The organic electroluminescent display panel including the color filter substrate has high light output efficiency and good display effect.

Preferably, the array substrate includes a second base and a plurality of pixel units arranged on the second base, each pixel unit includes a plurality of organic electroluminescent devices, and the adjacent organic electroluminescent display devices are isolated from each other by a pixel defining layer, wherein the section difference of the pixel defining layer is eliminated by a second adhesive layer.

Further preferably, the overlapped part of the two adjacent color filters on the light incident surface of the color filter substrate is in contact with the pixel defining layer on the array substrate, wherein the second adhesive layer is provided with scattering particles therein.

Further preferably, the scattering particles have material including any one or more of silicon oxide, zinc sulfide and zinc selenide.

Further preferably, the second adhesive layer is also provided with water absorbing particles therein.

Further preferably, the water absorbing particles have material including barium oxide or magnesium oxide.

Preferably, the organic electroluminescent devices are white organic electroluminescent devices.

The technical solutions adopted for solving the technical problems of the present invention involve a display device, including the above organic electroluminescent display panel.

The display device in this embodiment has a good display effect as including the organic electroluminescent display panel.

The technical solutions adopted for solving the technical problems of the present invention involve a manufacturing method of a color filter substrate, including the following steps:

forming a plurality of color filters and black matrixes on a first base, wherein any two adjacent color filters are at least partially overlapped, and each black matrix is at least partially arranged at the overlapped position of the color filters; and forming a first adhesive layer for eliminating section differences between the adjacent color filters or between the color filters and the black matrixes on the first base where the above step is completed, wherein the first adhesive layer is provided with scattering particles therein.

Preferably, the step of forming a plurality of color filters and black matrixes on a first base specifically includes:

forming a pattern including the black matrixes on the first base through a patterning process;

forming a pattern including first color filters on the base where the above step is completed through a patterning process, wherein the first color filters are at least partially overlapped with the black matrixes; and forming a pattern including second color filters on the base where the above steps are completed through a patterning process, wherein the second color filters are at least partially arranged at the overlapped positions of the first color filters and the black matrixes.

Preferably, the step of forming a plurality of color filters and black matrixes on a first base specifically includes:

forming a pattern including first color filters on the first base through a patterning process;

forming a pattern including second color filters on the base where the above step is completed through a patterning process, wherein the second color filters are at least partially overlapped with the first color filters; and forming a pattern including the black matrixes on the base where the above steps are completed through a patterning process, wherein the black matrixes are at least partially arranged at the overlapped positions of the first color filters and the second color filters.

Figure 1:
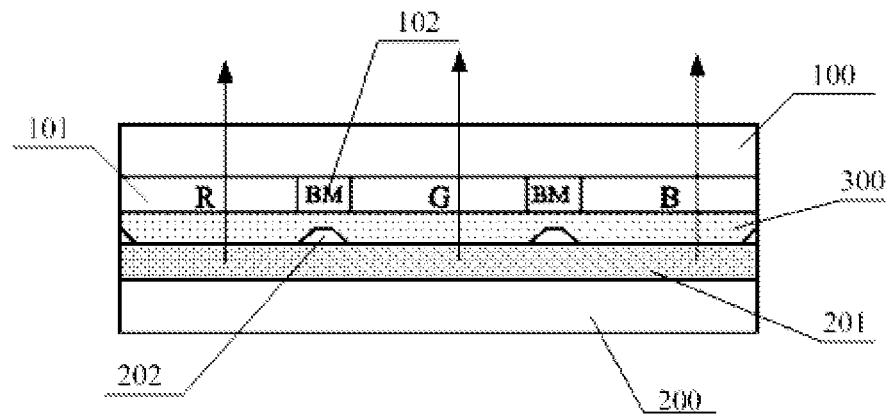
FIG. 1 is a schematic diagram of an organic electroluminescent display panel in the prior art.

Reference numerals: 100, first base; 101, color filter; 102, black matrix; 103, first adhesive layer; 200, second base; 201, organic electroluminescent material layer; 202, pixel defining layer; 203, second adhesive layer; 300, adhesive layer.

DETAILED DESCRIPTION OF THE EMBODIMENTS

To make those skilled in the art better understand the technical solutions of the present invention, the present invention will be further described in detail below in combination with the accompanying drawings and specific embodiments.

Embodiment 1

Figure 2:
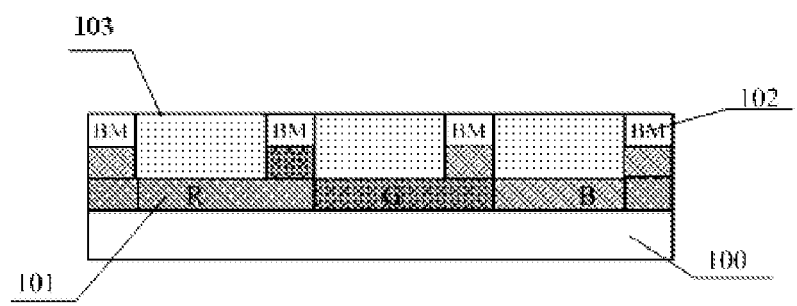
FIG. 2 is a schematic diagram of a color filter substrate in embodiment 1 of the present invention.
Figure 3:
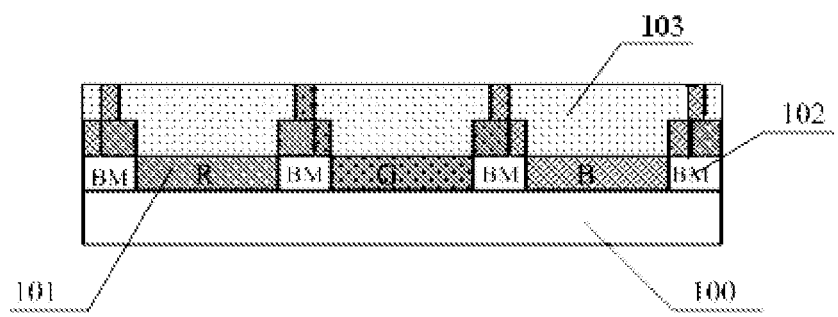
FIG. 3 is another schematic diagram of the color filter substrate in embodiment 1 of the present invention.

As shown in FIG. 2 and FIG. 3, this embodiment provides a color filter substrate, including a first base 100, and color filters 101 and black matrixes 102 arranged on the first base 100, wherein two adjacent color filters 101 are at least partially overlapped, and each black matrix 102 is at least partially arranged at the overlapped position of the two adjacent color filters 101, and the color filter substrate further includes a first adhesive layer 103 for eliminating section differences between the adjacent color filters 101 or between the color filters 101 and the black matrixes 102, and the first adhesive layer 103 is provided with scattering particles.

The first adhesive layer 103 of the color filter substrate in this embodiment is provided with the scattering particles, which may scatter light coming from a display light source, so that the light is more divergent and softer and the uniformity of the light is improved. In addition, in this embodiment, the two adjacent color filters 101 are at least partially overlapped, and the color filters 101 at the overlapped position are equivalent to a black matrix 102; meanwhile, each black matrix 102 on the color filter substrate is at least partially arranged at the overlapped position of the two adjacent color filters 101, which is equivalent to increasing the thickness of the black matrixes 102 on the color filter substrate; and it could be understood that, a color filter with a color (that is, corresponding to a sub-pixel) is arranged between two adjacent black matrixes 102, and in this case, because the thickness of the black matrixes 102 is increased, the light corresponding to the sub-pixel may be effectively prevented from being scattered to a sub-pixel adjacent to the sub-pixel after being scattered by the scattering particles, and thus brightness loss is avoided.

Figure 4:
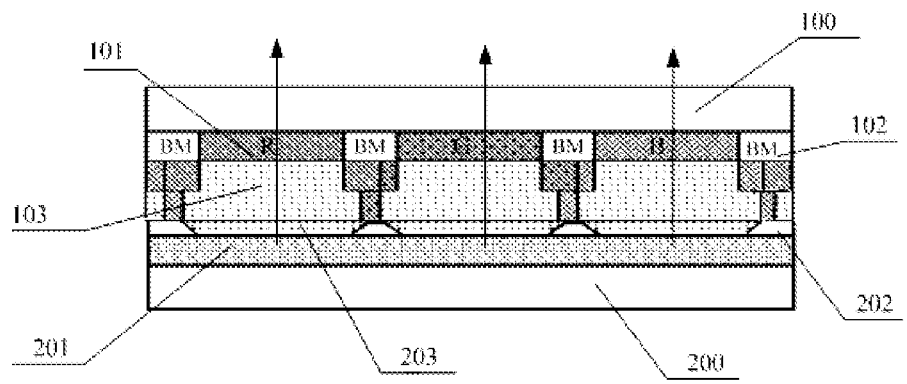
FIG. 4 is a schematic diagram of an organic electroluminescent display panel in embodiment 2 of the present invention.

It should be noted that, first, it is very difficult to simply thicken the black matrixes 102 due to the limitations of processes in the prior art; and second, the color filter substrate of this embodiment is particularly applicable to an organic electroluminescent display device, as shown in FIG. 4, the color filter substrate is cell-aligned with an array substrate, a plurality of organic electroluminescent devices (which are obtained by defining an organic electroluminescent material layer 201 with a pixel defining layer 202) are arranged on the array substrate, an organic electroluminescent device corresponds to a sub-pixel, light emitted by the organic electroluminescent devices is scattered by the scattering particles in the first adhesive layer on the color filter substrate, and then the light of each sub-pixel is limited by the relatively thickened black matrixes 102, so that the brightness and display effect of the organic electroluminescent display device may be effectively improved.

Preferably, as shown in FIG. 2, the color filters 101 are arranged on the first base 100, and each black matrix 102 is arranged above the overlapped part of the two adjacent color filters 101. Of course, preferably, as shown in FIG. 3, in this embodiment, the black matrixes 102 are arranged on the first base 100, and the overlapped position of the two adjacent color filters 101 is above the black matrix 102.

In this embodiment, the scattering particles are preferably made of any one of silicon oxide, zinc sulfide and zinc selenide. Of course, the scattering particles may also be made of other scattering materials such as metal oxides and high molecular polymers.

After cell aligning of the color filter substrate and the array substrate, some gaps are inevitably formed between the two substrates, and then oxygen, moisture, water and other substances may exist. In this case, preferably, the first adhesive layer 103 is further provided with water absorbing particles which may ensure that the structure formed after cell aligning of the color filter substrate and the array substrate is in a dry environment to prevent moisture, water and other substances from damaging components on the color filter substrate and the array substrate.

Further preferably, the water absorbing particles are made of barium oxide, magnesium oxide, zeolite or the like, and may also be made of other materials with water absorbency, of course.

Embodiment 2

Figure 5:
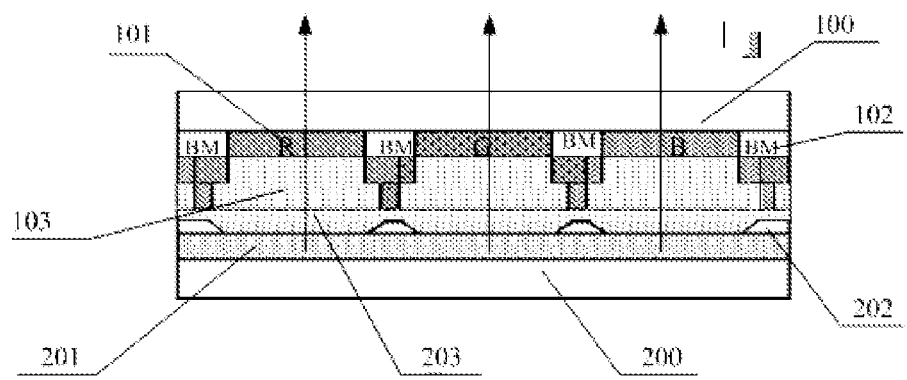
FIG. 5 is another schematic diagram of the organic electroluminescent display panel in embodiment 2 of the present invention.

As shown in FIG. 4 and FIG. 5, this embodiment provides an organic electroluminescent display panel, including the color filter substrate in embodiment 1 and an array substrate which is cell-aligned with the color filter substrate.

In this embodiment, the organic electroluminescent display panel including the color filter substrate in embodiment 1 has high light output efficiency and ensures good uniformity of light.

Preferably, the array substrate includes a second base 200 and a plurality of pixel units arranged on the second base 200, wherein each pixel unit includes a plurality of organic electroluminescent devices, and the adjacent organic electroluminescent display devices are isolated from each other by a pixel defining layer 202, wherein the section difference of the pixel defining layer 202 is eliminated by a second adhesive layer 203. Because the section difference on the light output surface of the array substrate is eliminated by the second adhesive layer 203, almost no gaps are formed between the color filter substrate of embodiment 1 and the array substrate after cell aligning of the two substrates, and thus oxygen, moisture, water and the like do not exist.

It should be noted that, as shown in FIG. 4, the second adhesive layer 203 is merely used for eliminating the section difference of the pixel defining layer 202; or as shown in FIG. 5, the second adhesive layer 203 is a planarization layer higher than the pixel defining layer 202, and is partially arranged above the pixel defining layer 202.

As shown in FIG. 4, preferably, the overlapped part of the two adjacent color filters 101 on the light incident surface of the color filter substrate is in contact with the pixel defining layer 202 on the array substrate, wherein the second adhesive layer 203 is provided with scattering particles therein. In this case, the light emitted by the organic electroluminescent devices may be further scattered, so that the display effect is better.

In this embodiment, the scattering particles in the second adhesive layer 203 are preferably made of any one of silicon oxide, zinc sulfide and zinc selenide. Of course, the scattering particles may also be made of other scattering materials such as metal oxides or high molecular polymers.

To ensure that a dry environment is better kept between the color filter substrate and the array substrate after cell aligning of the two substrates, the second adhesive layer 203 is preferably provided with water absorbing particles. Further preferably, the water absorbing particles are made of barium oxide, magnesium oxide, zeolite or the like, and may also be made of other materials with water absorbency, of course.

As shown in FIG. 4 and FIG. 5, the color filter substrate generally includes red, green and blue (R, G and B) color filters 101, so preferably, the organic electroluminescent devices in this embodiment are white organic electroluminescent devices. Of course, organic electroluminescent devices emitting light of other colors may be adopted according to the colors of the color filters 101 on the color filter substrate.

Embodiment 3

This embodiment provides a display device, including the organic electroluminescent display panel in embodiment 2.

The display device may be any product or component with a display function, such as a mobile phone, a tablet computer, a television, a display, a notebook computer, a digital photo frame or a navigator.

The display device including the organic electroluminescent display panel in embodiment 2 has better performance and better display effect.

Of course, the display device of this embodiment may further include other conventional structures, such as a power unit and a display drive unit.

Embodiment 4

This embodiment provides a manufacturing method of a color filter substrate, wherein the color filter substrate may be the one in embodiment 1. The manufacturing method specifically includes the following steps:

Step 1, a plurality of color filters and black matrixes are formed on a first base, wherein two adjacent color filters are at least partially overlapped, and each black matrix is at least arranged at the overlapped position of the two adjacent color filters.

This step specifically may be implemented by two methods:

I: forming a pattern including the black matrixes on the first base through a patterning process;

forming a pattern including first color filters on the base where the above step is completed through a patterning process, wherein the first color filters are at least partially overlapped with the black matrixes; and forming a pattern including second color filters on the base where the above steps are completed through a patterning process, wherein the second color filters are at least partially arranged at the overlapped positions of the first color filters and the black matrixes.

II: forming a pattern including first color filters on the first base through a patterning process;

forming a pattern including second color filters on the base where the above step is completed through a patterning process, wherein the second color filters are at least partially overlapped with the first color filters; and forming a pattern including the black matrixes on the base where the above steps are completed through a patterning process, wherein the black matrixes are at least partially arranged at the overlapped positions of the first color filters and the second color filters.

A first adhesive layer for eliminating section differences between the adjacent color filters or between the color filters and the black matrixes is formed on the first base where the above step is completed, and the first adhesive layer is provided with scattering particles therein. Of course, the first adhesive layer may also be provided with water absorbing particles therein.

It should be noted that, the manufacturing method of the color filter substrate in this embodiment may be a traditional method for manufacturing the color filter substrate, and mainly differs from the existing manufacturing method in that the formed first color filters and second color filters are at least partially overlapped.

This embodiment further provides a manufacturing method of an organic electroluminescent display panel, wherein the organic electroluminescent display panel may be the one in embodiment 2, and in this case, the color filter substrate of the organic electroluminescent display panel is manufactured by the above manufacturing method.

The manufacturing method of the organic electroluminescent display panel further includes:

sequentially forming an organic luminescent material layer and a pixel defining layer on a second base, wherein a plurality of organic electroluminescent devices are defined by the pixel defining layer;

forming a second adhesive layer on the second base where the above step is completed, wherein the second adhesive layer may be provided with scattering particles therein and may also be provided with water absorbing particles therein at the same time, thus forming an array substrate; and finally, performing cell aligning on the color filter substrate and the array substrate to form the organic electroluminescent display panel.

It could be understood that, the above embodiments are merely exemplary embodiments adopted for describing the principle of the present invention, and the present invention is not limited thereto. Various variations and improvements may be made for those of ordinary skill in the art without departing from the spirit and essence of the present invention, and these variations and improvements are also interpreted as within the protection scope of the present invention.

The invention claimed is:

1. A color filter substrate, comprising a first base, and a plurality of color filters and black matrixes arranged on the first base,
   wherein two adjacent color filters are at least partially overlapped, and each black matrix is at least partially arranged at the overlapped position of the two adjacent color filters; and
   wherein the color filter substrate further comprises a first adhesive layer for eliminating section differences between the adjacent color filters or between the color filters and the black matrixes, and the first adhesive layer is provided with scattering particles therein.

2. The color filter substrate of claim 1, wherein the black matrixes are arranged on the first base, and the overlapped part of the two adjacent color filters is above the black matrix.

3. The color filter substrate of claim 1, wherein the color filters are arranged on the first base, and each black matrix is arranged above the overlapped part of the two adjacent color filters.

4. The color filter substrate of claim 1, wherein the scattering particles have material including any one or more of silicon oxide, zinc sulfide and zinc selenide.

5. The color filter substrate of claim 1, wherein the first adhesive layer is also provided with water absorbing particles therein.

6. The color filter substrate of claim 5, wherein the water absorbing particles have material including barium oxide or magnesium oxide.

7. An organic electroluminescent display panel, comprising a color filter substrate, and an array substrate which is cell-aligned with the color filter substrate, wherein the color filter substrate, comprising a first base, and a plurality of color filters and black matrixes arranged on the first base,
   wherein two adjacent color filters are at least partially overlapped, and each black matrix is at least partially arranged at the overlapped position of the two adjacent color filters; and
   wherein the color filter substrate further comprises a first adhesive layer for eliminating section differences between the adjacent color filters or between the color filters and the black matrixes, and the first adhesive layer is provided with scattering particles therein.

8. The color filter substrate of claim 7, wherein the black matrixes are arranged on the first base, and the overlapped part of the two adjacent color filters is above the black matrix.

9. The color filter substrate of claim 7, wherein the color filters are arranged on the first base, and each black matrix is arranged above the overlapped part of the two adjacent color filters.

10. The color filter substrate of claim 7, wherein the scattering particles have material including any one or more of silicon oxide, zinc sulfide and zinc selenide.

11. The organic electroluminescent display panel of claim 7, wherein the array substrate comprises a second base and a plurality of pixel units arranged on the second base, each pixel unit comprises a plurality of organic electroluminescent devices, and the adjacent organic electroluminescent display devices are isolated from each other by a pixel defining layer, wherein the section difference of the pixel defining layer is eliminated by a second adhesive layer.

12. The organic electroluminescent display panel of claim 11, wherein the overlapped part of the two adjacent color filters on the light incident surface of the color filter substrate is in contact with the pixel defining layer on the array substrate, and the second adhesive layer is provided with scattering particles therein.

13. The organic electroluminescent display panel of claim 12, wherein the scattering particles in the second adhesive layer have material including any one or more of silicon oxide, zinc sulfide and zinc selenide.

14. The organic electroluminescent display panel of claim 12, wherein the second adhesive layer is also provided with water absorbing particles therein.

15. The organic electroluminescent display panel of claim 14, wherein the water absorbing particles in the second adhesive layer have material including barium oxide or magnesium oxide.

16. The organic electroluminescent display panel of claim 11, wherein the organic electroluminescent devices are white organic electroluminescent devices.

17. A display device, comprising the organic electroluminescent display panel of claim 7.

18. A manufacturing method of a color filter substrate, comprising:
   forming a plurality of color filters and black matrixes on a first base, wherein two adjacent color filters are at least partially overlapped, and each black matrix is at least arranged at the overlapped position of the color filters; and
   forming a first adhesive layer for eliminating section differences between the adjacent color filters or between the color filters and the black matrixes on the first base where the above step is completed, wherein the first adhesive layer is provided with scattering particles therein.

19. The manufacturing method of the color filter substrate of claim 18, wherein the step of forming a plurality of color filters and black matrixes on a first base specifically comprises:
   forming a pattern comprising the black matrixes on the first base through a patterning process;
   forming a pattern comprising first color filters on the base where the above step is completed through a patterning process, wherein the first color filters are at least partially overlapped with the black matrixes; and
   forming a pattern comprising second color filters on the base where the above steps are completed through a patterning process, wherein the second color filters are at least partially arranged at the overlapped positions of the first color filters and the black matrixes.

20. The manufacturing method of the color filter substrate of claim 18, wherein the step of forming a plurality of color filters and black matrixes on a first base specifically comprises:
   forming a pattern comprising first color filters on the first base through a patterning process;
   forming a pattern comprising second color filters on the base where the above step is completed through a patterning process, wherein the second color filters are at least partially overlapped with the first color filters; and
   forming a pattern comprising the black matrixes on the base where the above steps are completed through a patterning process, wherein the black matrixes are at least partially arranged at the overlapped positions of the first color filters and the second color filters.

\* \* \* \* \*